United States Patent [19]

Day et al.

[11] Patent Number: 5,184,077

[45] Date of Patent: Feb. 2, 1993

[54] ABRASION-RESISTANT, HIGH PRESSURE DIELECTRIC SENSORS

[75] Inventors: David R. Day, Charlestown; Farhad Bybordi, Topsfield, both of Mass.

[73] Assignee: G-C Acquisition, Inc., Newton Centre, Mass.

[21] Appl. No.: 766,956

[22] Filed: Sep. 25, 1991

Related U.S. Application Data

[63] Continuation of Ser. No. 505,236, Apr. 5, 1990, abandoned.

[51] Int. Cl.⁵ .............................................. G01R 27/02
[52] U.S. Cl. ....................................... 324/693; 526/60
[58] Field of Search ............... 324/693, 694, 696, 724; 526/60

[56] References Cited

U.S. PATENT DOCUMENTS

| | | | |
|---|---|---|---|
| 3,710,237 | 1/1973 | Watson et al. | 324/696 |
| 4,332,167 | 6/1982 | Sun et al. | 324/690 |
| 4,399,100 | 8/1983 | Zsolnay et al. | 422/62 |
| 4,423,371 | 12/1983 | Senturia et al. | 324/61 R |
| 4,496,697 | 1/1985 | Zsolnay et al. | 526/60 |
| 4,522,060 | 6/1985 | Murata et al. | 324/696 |
| 4,535,285 | 8/1985 | Evans et al. | 324/71.1 |
| 4,571,543 | 2/1986 | Raymond et al. | 324/696 |
| 4,573,010 | 2/1986 | Barker, Jr. et al. | 324/724 |
| 4,777,431 | 11/1988 | Day et al. | 324/61 P |
| 4,868,491 | 9/1989 | Black | 324/694 |

FOREIGN PATENT DOCUMENTS 1269042 10/1989 Japan .................... 324/693

Primary Examiner—Jack B. Harvey
Assistant Examiner—Maura K. Regan
Attorney, Agent, or Firm—Wolf, Greenfield & Sacks

[57] ABSTRACT

An apparatus which is particularly useful in measuring dielectric changes in materials, even when subjected to abrasive and/or high-pressure environments. The apparatus includes a housing adapted to mounting within a vessel containing the material to-be-tested, the housing presenting at least one exposed surface to the interior of the vessel to contact the material and a set of first and second electrodes which are disposed on the exposed surface of the housing to make contact with the material, such that the dielectric properties of the material within the vessel can be monitored. The apparatus is particularly useful in the monitoring of curing of resins in both high and low pressure molding operations, including sheet molding compound (SMC) processes, reactive injection molding (RIM) techniques and similar operations.

18 Claims, 2 Drawing Sheets

ABRASION-RESISTANT, HIGH PRESSURE DIELECTRIC SENSORS

This application is a continuation of application Ser. No. 505,236, filed Apr. 5, 1990, now abandoned.

BACKGROUND OF THE INVENTION

The technical field of this invention is dielectrometry and, in particular, devices for sensing changes in the dielectric properties of materials undergoing state transitions, such as resins and other materials undergoing curing during molding processes.

In the manufacture of parts molded from polymeric composites, it is advantageous to employ on-line monitoring devices to measure the progress of curing. For example, parts of optimal density and strength can require careful control of the heating rate, temperature gradients within the part, the timing and amount of applied pressure, and the cooling rate. In the past, control of these parameters has been conducted according to fixed schedules and often determined by trial-and-error methods.

A.C. measurements of dielectric properties by sensors implanted within a curing polymer can provide useful data on curing and other material properties. In particular, U.S. Pat. No. 4,423,371 issued to Senturia et al. in December 1983, discloses A.C. measurements in the frequency range of about 1 Hz to about 10 Hz and can be reliable indicators of curing. See also, U.S. Pat. No. 4,399,100 issued to Zsolnay et al. in August 1983, and U.S. Pat. No. 4,496,697 issued to Zsolnay et al. in January 1985, for further disclosures of automated process control systems for curing polymeric materials. Additionally, see U.S. Pat. No. 4,777,431 issued to Day et al. on Oct. 11, 1988, for a disclosure of a sensor adapted for at least partial implantation into the polymeric material undergoing curing to provide on-line monitoring of material property changes.

Typically, prior approaches to on-line monitoring of materials undergoing state transitions have required the implantation of a sensor into the polymeric material. This can lead to problems when the shape of the part does not permit placement of a dielectric sensor in either a portion of the part which will be trimmed off during subsequent finishing operations or into a region of the part where it will not affect the strength and be allowed to remain in the finished article. Additionally, this approach precludes the reuse of sensors.

Moreover, prior art sensors have not been well-suited for use in high pressure molding operations, such as reactive injection molding and the like, where the curing of the part occurs at high pressure that can damage or destroy the sensor element. Likewise, prior art embedded sensor have been impractical when the material contained abrasive components or fillers which can damage or destroy the casing or electrode structure. There exists a need for more reliable, abrasion-resistant, high temperature and high pressure-tolerant sensors for measuring dielectric property changes during manufacturing processes, especially molding operations to permit on-line monitoring and testing of materials.

SUMMARY OF THE INVENTION

An apparatus is disclosed which is particularly useful in measuring dielectric changes in materials, even when subjected to abrasive and/or high-pressure environments. The apparatus includes a housing adapted to mounting within a vessel containing the material to-be-tested, the housing presenting at least one exposed surface to the interior of the vessel to contact the material, and a set of first and second electrodes which are disposed on the exposed surface of the housing to make contact with the material, such that the dielectric properties of the material within the vessel can be monitored. The apparatus is particularly useful in the monitoring of curing of resins in high pressure molding operations, such as reactive injection molding (RIM) techniques and similar operations.

Preferably, the housing is made of a high-strength, wear-resistant, insulative material, such as a ceramic or organic insulator. Preferred ceramic materials include glass or quartz structures or ceramic composites, such as $Al_2O_3$, $AlSiO_4$, and $ZrO_2$ glass matrices.

In one aspect of the invention, a sensor is disclosed in which the electrode structures are mounted flush with the surface of the housing that is exposed to interior of the material-containing vessel to minimize abrasive damage to the electrode structure during monitoring. This flush-mounted configuration can be achieved, for example, by milling a pattern of grooves in the housing surface and then depositing a conductive material within the grooves to form the first and second electrodes in spaced-apart relationship to each other. The conductive lines of the electrode structures preferably are arranged to form a pair of interdigitated electrodes. This arrangement is particularly useful in order to obtain a reliable and uniform measurement of the material undergoing testing.

In another aspect of the invention, the size and spacing of the electrodes are chosen to minimize boundary artifacts at the interface between the surface of the sensor (with its exposed electrodes) and the material. It has been found that measurements taken directly at the surface can be distorted by contamination, mold release effects, boundary layers, etc. It is, therefore, desirable to configure the electrode structure to "see through" the surface layer (approximately 5 to 25 microns) of material. By appropriate line-width and spacing choices, the sensors of the present invention can be configured to measure dielectric properties deeper into the material and, thereby, minimize the boundary artifacts.

In yet another aspect of the invention, manufacturing techniques are disclosed for fabricating the sensors of the present invention. In one embodiment, a ceramic material, such as alumina, is chosen to form the housing and appropriately shaped for insertion into a wall of the molding vessel. Initially, the part is formed with scaled-up dimensions to compensate for shrinkage during ceramic firing. Prior to firing, the housing is milled, for example, using a computerized milling machine to form grooves which define a desired (again, scaled-up) pattern of grooves about 25 to about 1,000 micrometers in depth. The shaped housing is then fired (for example, at about 1,500° C. and allowed to cool. The surface of the fired ceramic part which will be exposed to the vessel interior is then coated (e.g., with a silver based conductive ink) and fired again, for example, at 1,000° C. to fuse the ink. The part is then allowed to cool, and the electrode-bearing surface polished to remove any excess ink from the electrode pattern, thus, yielding a smooth surface with a flush-mounted, electrode pattern for use in on-line monitoring applications.

The invention will next be described in connection with certain illustrated embodiments; however, it should be clear that various changes, additions and subtractions can be made by those skilled in the art without departing from the spirit or scope of the claims.

DETAILED DESCRIPTION

Figure 1:
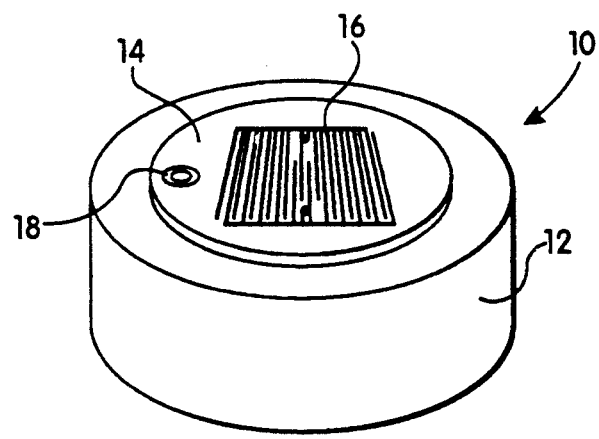
FIG. 1 is a perspective view of an apparatus for dielectric measurements according to the invention.

In FIG. 1, an apparatus 10 for dielectric measurements is shown, including a housing 12 having at least one surface 14 which is exposed to the material to-be-tested and an electrode array 16, disposed on the exposed surface. The apparatus 10 can further include a temperature and/or pressure sensor 18 also disposed on the exposed surface 14 of housing 12.

Flush-mounted electrode structures can be formed on the surface of the housing, for example, by milling a pattern of grooves using a computerized milling machine or the like. The term "milling" is used herein to encompass both mechanical and ion milling techniques, as well as similar groove forming procedures. Alternatively, a photoresist patterning and etching technique can be used to form grooves in the surface of the substrate. The etching operations can be achieved by sputter etching, plasma etching, chemical etching, or the like. In any event, the grooves formed by milling or etching can then be filled with a conductive material, such as a silver-based (e.g., silver-palladium), printed circuit ink, which is then dried and fired to form the electrode structure.

In one illustrated embodiment, the electrodes are configured as an interdigitated pair in which each electrode line is about 25 to about 1,000 micrometers wide and separated from neighboring lines by a similar distance of about 25 to about 1,000 micrometers. This configuration has been found to permit measurements of the material extending at least 25 to about 1,000 micrometers in depth (in the direction perpendicular to sensor surface) to minimize the boundary artifacts which can be otherwise introduced by surface measurements.

Figure 2:
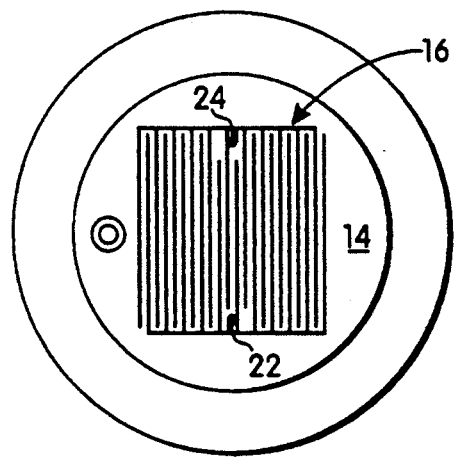
FIG. 2 is a top view of the apparatus shown in FIG. 1.
Figure 3:
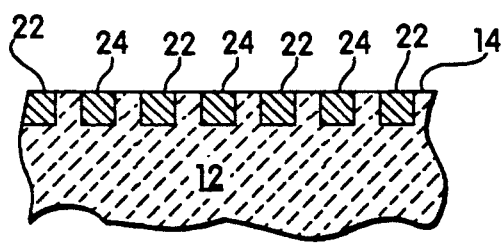
FIG. 3 is a cross-sectional view of the exposed surface region of the apparatus of FIG. 1.

As shown in more detail in FIGS. 2 and 3, electrode array 16 can include a first electrode 22 and a second electrode 24 arranged as an interdigitated electrode pair. As illustrated by FIG. 3, the electrodes 22 and 24 are formed flush with the surface 14 of the housing.

The housing 12 is preferably constructed of a high-strength, wear resistant material, such as high purity alumina (e.g., AMALOX-68 available from Astromet Co., Cincinnati, Ohio, or DURAMIC-HT995 available from Morgan-Matrox, Inc., Palisades Park, N.J.) or other ceramic composite materials, such as zirconia, fused silica, or mixed compounds.

As shown in FIGS. 1 and 2, the apparatus can further include a temperature and/or pressure sensor 18. Temperature sensors, for example, high temperature thermocouples, are commercially available from various sources (e.g., Omega Corporation, Stamford, Conn.). Likewise, pressure sensors, useful in connection with the present invention, are also commercially available (e.g., from Dynisco Inc., Norwood, Mass., or Kistler Co., Amherst, N.Y.).

Figure 4:
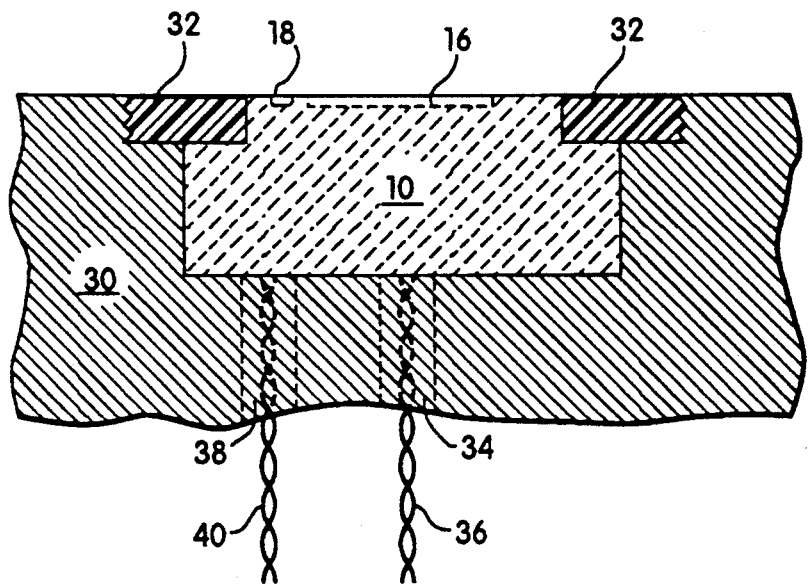
FIG. 4 is a side view of an apparatus for dielectric measurements disposed within a vessel wall.

In FIG. 4, the apparatus 10 of the present invention is shown mounted within a wall 30 of a high pressure molding system. As shown, the housing of apparatus 10 is mounted in a recess in the wall 30, such that the electrode array 16 is situated on a surface which is exposed to the interior of the molding system to make contact with the polymeric material undergoing molding. The apparatus 10 is secured in place by seal 32, which can be a simple O-ring type seal or, as shown in FIG. 4, can be a threaded ring which screwed down into mating threads in the recess of wall 30 to firmly secure the apparatus in place. (It should be apparent that other mechanisms, such as clips or snap-rings, can, likewise, be used with or without a gasket material to secure the apparatus 10 within wall 30.) Vessel wall 30 also preferably includes holes 34 and 38 to receive the lead wires 36 and 40 from the electrode array 16 and temperature/pressure sensor 18, respectively.

Figure 5:
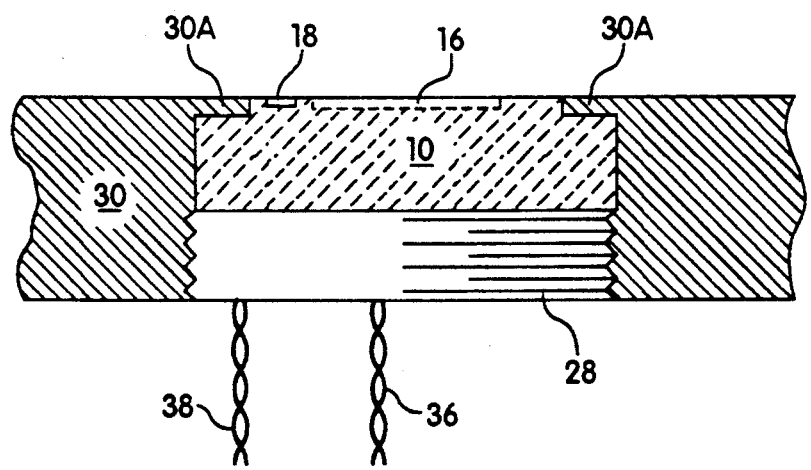
FIG. 5 is a side view of an apparatus for dielectric measurements disposed in another configuration within a vessel wall.

In FIG. 5, an alternative approach is shown for mounting the apparatus 10 within a wall 30 of a molding system or other vessel. In this embodiment, the wall includes a rimmed hole which receives the housing of apparatus 10, such that the apparatus can be mounted in place from the outside of molding system. Rim 30A serves to prevent the apparatus from falling into the mold or other vessel. Set screw 28 can be used to secure the apparatus in place within the recess such that the electrode array 16 and temperature/pressure sensor 18 are situated on a surface which is again exposed to the polymeric material undergoing shaping and/or curing. (It should be apparent that other mechanisms, including clips, clamps and gaskets, can be employed as an alternative or supplement to screw 28; likewise, the set screw can be replaced by screw threads or other sealing means which are incorporated directly into the housing of apparatus 10.) As shown in FIG. 5, this embodiment permits direct access to lead wires 36 and 38 from the electrode array 16 and temperature/pressure sensor 18, respectively.

In use, the apparatus 10 can be employed with a molding systems, such as shown in either FIG. 4 or FIG. 5, and used to monitor the curing of resins and the like.

What is claimed is:

1. Apparatus for measuring the dielectric properties for an abrasive polymeric material during curing, the apparatus comprising:

an abrasion-resistant ceramic housing adapted for mounting within a vessel containing a polymeric material, the housing presenting at least one exposed surface to contact said material;

a first electrode disposed at said surface and exposed to make direct contact with the material; and a second electrode also disposed at said surface and exposed in spaced-apart relationship to said first electrode to, likewise, make direct electrical contact with the material, said electrodes being flush-mounted with the exposed surface of the vessel and separated by a distance that permits measurement of the abrasive polymeric material's properties while minimizing boundary artifacts.

2. The apparatus of claim 1 wherein the apparatus further comprises a sealing means for mounting the housing in a high pressure molding system.

3. The apparatus of claim 1 wherein said first and second electrodes are formed by conductive printing ink.

4. The apparatus of claim 1 wherein said first and second electrodes are disposed in an interdigitated pattern.

5. The apparatus of claim 1 wherein the apparatus further comprises a temperature measuring means incorporated into said housing for measuring the temperature of the material.

6. The apparatus of claim 1 wherein the apparatus further comprises a pressure sensing means incorporated into said housing for measuring the pressure within the vessel.

7. The apparatus of claim 1 wherein the ceramic material comprises an alumina material.

8. The apparatus of claim 1 wherein the spacing between said first and second electrodes is chosen to define a fundamental wavenumber that permits the measurement of dielectric properties in a region extending at least 25 micrometers from said surface to minimize boundary effects on the dielectric measurements.

9. The apparatus of claim 8 wherein the said first and second electrodes are disposed in an interdigitated pattern.

10. The apparatus of claim 9 wherein the width of individual lines in said interdigitated pattern ranges from about 25 to about 1,000 micrometers.

11. The apparatus of claim 8 wherein the spacing between individual lines in said interdigitated pattern ranges from about 20 to about 1,000 micrometers.

12. A method of fabricating a dielectric sensor, the method comprising:
    forming an abrasion-resistant, ceramic housing adapted to be mounted within a vessel, containing polymeric materials such that at least one surface of the housing is exposed to the interior of the vessel; and
    disposing a first electrode and a second electrode flush with said surface in spaced-apart relationship and exposed to make direct electrical contact with a material in said vessel with the spacing between said electrodes chose to measure material properties while minimizing boundary artifacts.

13. The method of claim 12 wherein the step of forming a housing further comprises forming a ceramic housing with a pattern of grooves in said surface.

14. The method of claim 13 wherein the grooves are formed by milling.

15. The method of claim 13 wherein the grooves are formed by etching.

16. The method of claim 13 wherein the method further comprises firing the ceramic material after forming said grooves.

17. The method of claim 13 wherein the method further comprises depositing a conductive material in said grooves to form a first electrode and a second electrode in spaced-apart relationship.

18. The method of claim 17 wherein the step of depositing a conductive material further comprises depositing a silver-based printing ink and then drying said ink to form said electrodes.

* * * * *

UNITED STATES PATENT AND TRADEMARK OFFICE
CERTIFICATE OF CORRECTION

PATENT NO. : 5,184,077
DATED : February 2, 1993
INVENTOR(S) : Day et al.

It is certified that error appears in the above—identified patent and that said Letters Patent is hereby corrected as shown below:

Col. 5, line 32 - delete "20" and substitute -- 25 --.

Col. 6, line 12 - delete "chose" and substitute -- chosen --.

Item [57] ABSTRACT, line 1, after "apparatus" insert --is disclosed--.

Signed and Sealed this

Sixteenth Day of November, 1993

Attest:

BRUCE LEHMAN

Attesting Officer        Commissioner of Patents and Trademarks